United States Patent
Kim et al.

(10) Patent No.: US 11,981,991 B2
(45) Date of Patent: *May 14, 2024

(54) SPUTTER TRAP HAVING A THIN HIGH PURITY COATING LAYER AND METHOD OF MAKING THE SAME

(71) Applicant: Honeywell International Inc., Charlotte, NC (US)

(72) Inventors: Jaeyeon Kim, Liberty Lake, WA (US); Patrick Underwood, Charlotte, NC (US); Susan D. Strothers, Mead, WA (US); Shih-Yao Lin, Hsinchu (TW); Michael D. Payton, Rockford, WA (US); Scott R. Sayles, Mead, WA (US)

(73) Assignee: Honeywell International Inc., Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/094,757

(22) Filed: Jan. 9, 2023

(65) Prior Publication Data

US 2023/0143320 A1 May 11, 2023

Related U.S. Application Data

(63) Continuation of application No. 16/531,882, filed on Aug. 5, 2019, now Pat. No. 11,584,985.
(Continued)

(51) Int. Cl.
*H01J 37/34* (2006.01)
*C23C 14/34* (2006.01)
*C23C 14/56* (2006.01)

(52) U.S. Cl.
CPC ........ *C23C 14/564* (2013.01); *C23C 14/3407* (2013.01); *H01J 37/3435* (2013.01); *H01J 37/3491* (2013.01)

(58) Field of Classification Search
CPC ............... H01J 37/3435; H01J 37/3491; H01J 37/32477; H01J 37/32853;
(Continued)

(56) References Cited

U.S. PATENT DOCUMENTS 5,433,835 A * 7/1995 Demaray ............ H01J 37/3435
  204/298.12
6,074,279 A  6/2000 Yoshimura et al.
(Continued)

FOREIGN PATENT DOCUMENTS

CN  1467267 A  1/2004
CN  1806316 A  7/2006
(Continued)

OTHER PUBLICATIONS

Zhou et al. "Titanium and Titanium Alloy Coatings for Corrosion Protection", Proceedings on the 12" World Conference on Titanium, 2011, pp. 1906-1910 (Year: 2011).*
(Continued)

*Primary Examiner* — Rodney G McDonald
(74) *Attorney, Agent, or Firm* — Faegre Drinker Biddle & Reath LLP

(57) ABSTRACT

An aluminum or copper alloy sputtering chamber includes a front surface, a back surface opposite the front surface, and a sputter trap formed on at least a portion of the front surface A coating of titanium particles is formed on the sputter trap.

20 Claims, 8 Drawing Sheets

Related U.S. Application Data

(60) Provisional application No. 62/717,994, filed on Aug. 13, 2018.

(58) Field of Classification Search
CPC ............. H01J 37/32871; C23C 14/564; C23C 14/3407; C23C 14/3414; C23C 14/34; C23C 24/04
USPC ........................... 204/298.12, 298.13, 298.11
See application file for complete search history.

(56) References Cited

U.S. PATENT DOCUMENTS

| | | | |
|---|---|---|---|
| 6,451,176 | B1 | 9/2002 | Vernon et al. |
| 6,855,236 | B2 * | 2/2005 | Sato .................... C23C 16/4404 118/728 |
| 8,709,335 | B1 | 4/2014 | Vlcek et al. |
| 8,734,896 | B2 * | 5/2014 | Volchko .................. C23C 24/04 427/427 |
| 9,879,348 | B2 | 1/2018 | Sun et al. |
| 11,584,985 | B2 * | 2/2023 | Kim .................. H01J 37/32853 |
| 2002/0090464 | A1 | 7/2002 | Jiang et al. |
| 2002/0168466 | A1 * | 11/2002 | Tapphorn ................ B05B 7/226 427/454 |
| 2003/0116425 | A1 | 6/2003 | Okabe et al. |
| 2004/0089543 | A1 | 5/2004 | Kim |
| 2004/0206804 | A1 | 10/2004 | Kim et al. |
| 2005/0147742 | A1 | 7/2005 | Kleshock et al. |
| 2012/0199469 | A1 * | 8/2012 | Rasheed ............. C23C 14/3407 204/192.1 |
| 2013/0277203 | A1 * | 10/2013 | Rasheed ............. H01J 37/3447 204/192.1 |
| 2017/0229295 | A1 | 8/2017 | Kim et al. |
| 2018/0171465 | A1 | 6/2018 | Kim et al. |
| 2020/0048761 | A1 | 2/2020 | Kim et al. |
| 2020/0240004 | A1 | 7/2020 | Kim et al. |

FOREIGN PATENT DOCUMENTS

| | | |
|---|---|---|
| CN | 103348037 A | 10/2013 |
| CN | 104831242 A | 8/2015 |
| CN | 107043911 A | 8/2017 |
| CN | 107267945 A | 10/2017 |
| JP | 10-298743 A | 11/1998 |
| JP | 2018-109202 A | 7/2018 |
| TW | 381123 B | 2/2000 |
| TW | 201243078 A | 11/2012 |
| TW | 201828338 A | 8/2018 |
| WO | 2005/077677 A1 | 8/2005 |
| WO | 2013/095070 A1 | 6/2013 |
| WO | 2018/123132 A1 | 7/2018 |
| WO | 2012068782 A1 | 5/2021 |

OTHER PUBLICATIONS

Galventto et al. "XRD and XPS study on reactive plasma sprayed titanium-titanium nitride coatings", Thin Solid Films 384 (2001) 223-229 (Year: 2001).*

Grujicic, M. et al. (2004). Analysis of the impact velocity of powder particles in the cold-gas dynamic-spray process. Materials Science and Engineering A368: 222-230.

International Search Report and Written Opinion received for PCT Patent Application No. PCT/US2019/046157, dated Dec. 3, 2019, 7 pages.

Jin-Hyeon Cho et al. (2011). Manufacture and Properties of Cold Spray Deposited Large Thickness Cu Coating Material for Sputtering Target, Met. Mater. Int., 17(1):157-166.

Lee, Kee-Ahn et al. (2014). Cu Based Sputtering Target Materials for Solar Cell Manufactured by Cold Spray Deposition, Current Nanoscience, 10:20-22.

Winnicki, M. et al. (2017). Microscopic Examination of Cold Spray Cermet Sn+In2O3 Coatings for Sputtering Target Materials, Research Article, Hindawi, Scanning, vol. 2017:1-10.

Young-Min Jin et al. (2011). Manufacturing and Macroscopic Properties of Cold Sprayed Cu—In Coating Material for Sputtering Target, Journal of Thermal Spray Technology, 20(3):497-507.

Zhigang et al., "Corrosion and Leakage Prevention Engineering for Ships," Dec. 31, 2017, 3 pages.

* cited by examiner

SE

BSE

SE

BSE

SPUTTER TRAP HAVING A THIN HIGH PURITY COATING LAYER AND METHOD OF MAKING THE SAME

CROSS-REFERENCE TO RELATED APPLICATION

This application is a continuation application of U.S. patent application Ser. No. 16/531,882, filed Aug. 5, 2019, which claims priority to U.S. Provisional Application No. 62/717,994, filed Aug. 13, 2018, both of which are herein incorporated by reference in their entireties.

TECHNICAL FIELD

The instant disclosure relates to sputter or particle traps for use on sputtering chamber components and methods of making the same. More particularly, the instant disclosure relates to surface roughened sputter traps having a thin coating layer thereon.

BACKGROUND

Physical vapor deposition ("PVD") methodologies are used to form a thin film or layer of material over a variety of substrates. PVD methods can be used in, for example, semiconductor fabrication processes to form metallized layers in the fabrication of integrated circuitry structures and devices. In one PVD process, known as sputtering, atoms are ejected from the surface of a sputtering target by bombardment with gas ions such as plasma. Thus, the sputtering target is the source of material which is deposited onto a substrate.

A diagrammatic view of a portion of an exemplary sputter deposition apparatus 8 is shown in FIG. 1. In one configuration, a sputtering target assembly 10 comprises a backing plate 12 having a target 14 bonded thereto. A substrate 18 such as a semiconductive material wafer is within the sputter deposition apparatus 8 and provided to be spaced from the target 14. As shown, the target 14 is disposed above the substrate 18 and is positioned such that a sputtering surface 16 faces the substrate 18.

In operation, sputtered material 22 is displaced from the surface 16 of the target 14 and forms a thin film 20 on the substrate 18. In some embodiments, suitable substrates 18 include wafers used in semiconductor fabrication. For example, the target 14 is bombarded with energy until atoms from the surface 16 are released into the surrounding atmosphere and subsequently deposited on the substrate 18. In some embodiments, plasma sputtering is used to deposit a thin metal film onto-substrates such as wafers for use in electronics.

Problems can occur in the deposition process if particles are formed, as these particles may fall into or onto a deposited film and disrupt desired properties of the thin film. A sputter trap or particle trap can be included on a sputtering target to capture particles formed during a deposition process. Additionally, there remains a risk that captured particles may flake off of the sputtering target and disrupt the thin film. For example, loosely held particles may flake from a sputter trap during cyclic thermal stress. Accordingly, it is desired to develop a sputter or particle trap that can be applied to a sputtering component, such as a sputtering target, which captures and retains particles formed during a deposition process. Capture and retention of such particles reduces the probability that a particle falls onto the deposited film during the deposition process.

SUMMARY

In one example, a sputtering chamber component includes a front surface, a back surface opposite the front surface, and a sputter trap formed on at least a portion of the front surface. The sputter trap has a surface roughness greater than the back surface of the sputtering chamber component. The sputter trap also has a coating of metallic particles formed on the sputter trap. The coating has a thickness from about 0.025 mm to about 2.54 mm (0.001 inches to about 0.1 inches) and is substantially free of impurities. The particles of the coating are substantially diffused.

In another example, a method of forming a sputter trap on a sputtering chamber component includes cold spraying metallic particles on at least a portion of a textured surface of the sputtering chamber component to form a layer. The layer has a thickness from about 0.025 mm to about 2.54 mm (0.001 inches to about 0.1 inches).

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
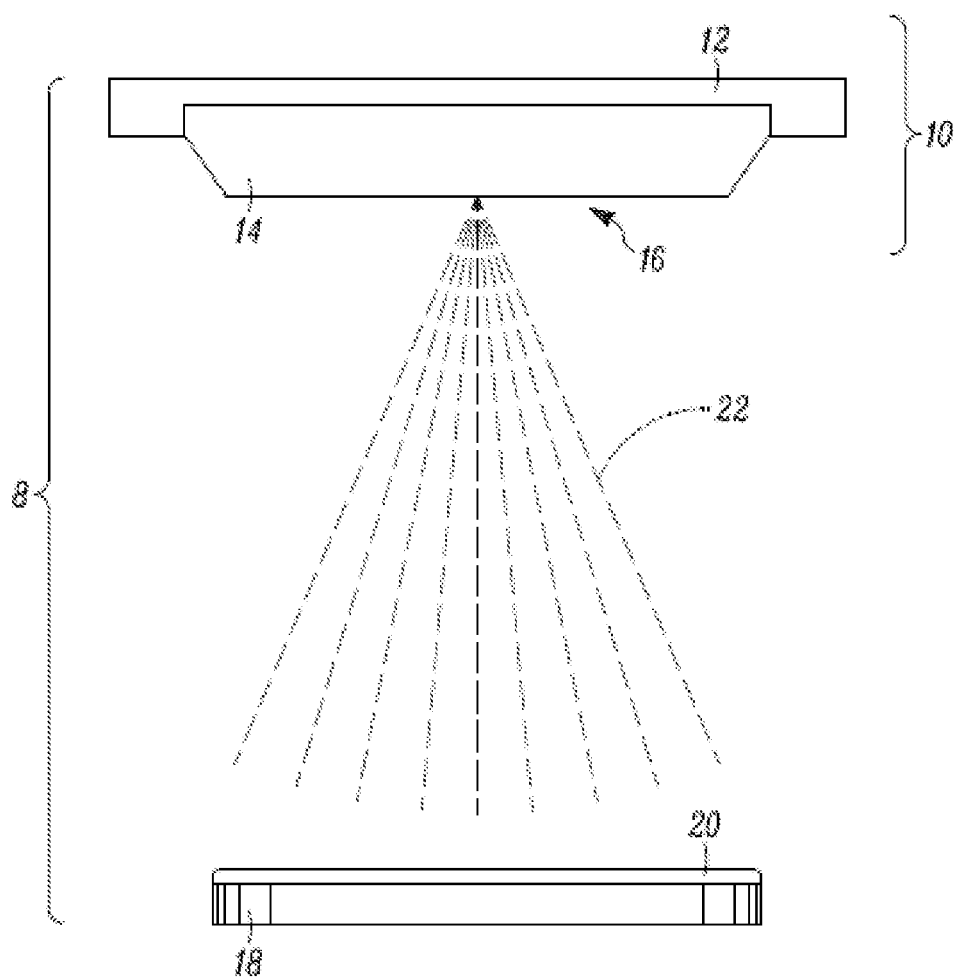
FIG. 1 is a schematic view of a portion of a physical vapor deposition apparatus, according to some embodiments.

Various modifications and additions can be made to the exemplary embodiments discussed without departing from the scope of the present invention. For example, while the embodiments described above refer to particular features, the scope of these invention also includes embodiments having different combinations of features and embodiments that do not include all of the above described features.

DETAILED DESCRIPTION

Disclosed herein are sputtering chamber components for use within a sputtering chamber having a sputter trap and a thin coating layer thereon. Also disclosed herein are methods for forming the component.

Sputter traps are important during physical vapor deposition (PVD) processes to prevent contaminating particles from redepositing on a substrate within the physical vapor deposition apparatus. During a sputtering process, sputtered particles are ejected into the gas phase and may deposit on any surface in the sputtering chamber. Over time, these deposits build up and may become dislodged or flake off during the sputtering process, forming particulates that may redeposit onto the substrate and lead to contamination of the substrate. A sputter trap prevents sputtering particles from redepositing onto the substrate during the sputtering process.

In some instances, sputtering chamber components can be modified to function as sputtered material re-adhesion sites and/or sputter traps. For example, a material re-adhesion site or sputter trap may include a specifically patterned surface that reduces particle flaking by increasing surface area while eliminating flat and angular surfaces. Thus, in some instances, the sputter trap may include a surface that has indentations or depressions formed into the surface. The indentations or depressions may be formed in a patterned arrangement or may form a macrotexture. A macrotexture is defined as a plurality of features arranged upon the surface of the sputter trap. In some instances, the sputter trap may also include a microtexture formed onto the macrotexture. A microtexture is defined as a texture, pattern, or any other such plurality of features that is applied to the surface contour of the macrotexture (e.g., the plurality of features of the macrotexture). This microtextured surface may further enhance adhesion of the sputtered material onto the sputter trap, as discussed above.

In some instances, additional layers of material may also be added to the surface of the sputter trap to further improve adhesion. However, it is important that the macrotexture and/or microtexture of the surface be retained after addition of these layers to the surface of the sputter trap to maintain the functionality of the texture(s). It has been found that application of a thin, high purity metallic coating layer onto the surface of the sputter trap may improve surface cleanness by reducing undesirable impurities, thus improving adhesion of sputtered material onto the sputter trap while retaining the desired surface texture of the sputter trap.

Suitable sputtering chamber components include a sputtering target, a coil and other components positioned within the sputtering chamber on which particles may accumulate.

Figure 2:
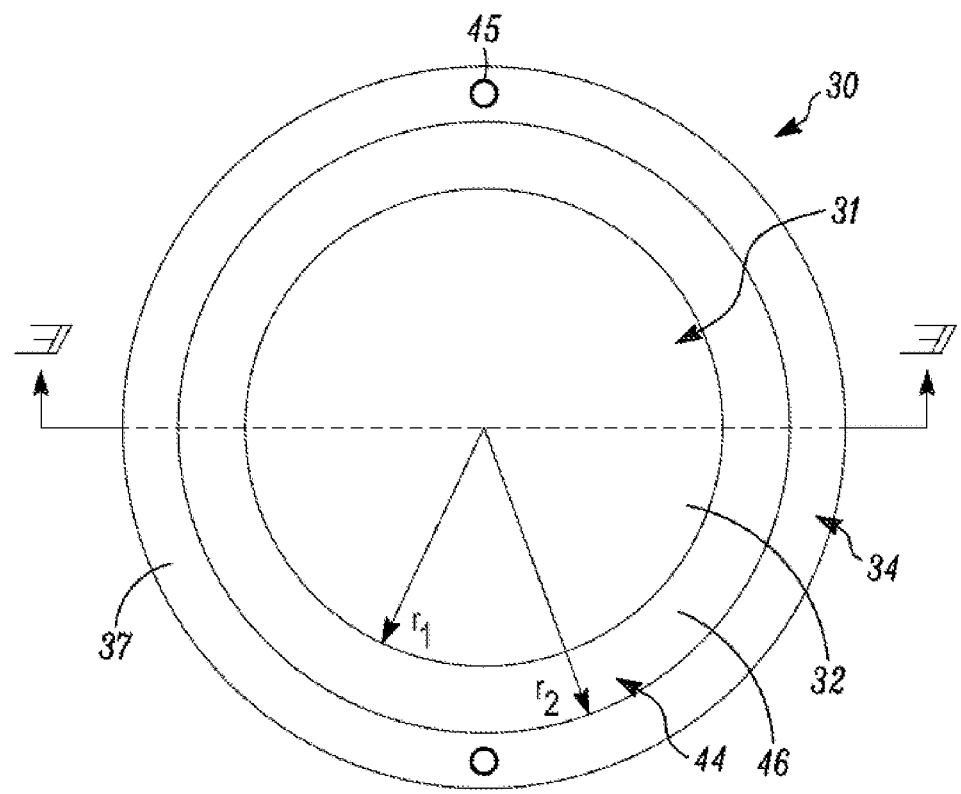
FIG. 2 is a schematic top view of an exemplary sputtering target assembly, according to some embodiments.
Figure 3:
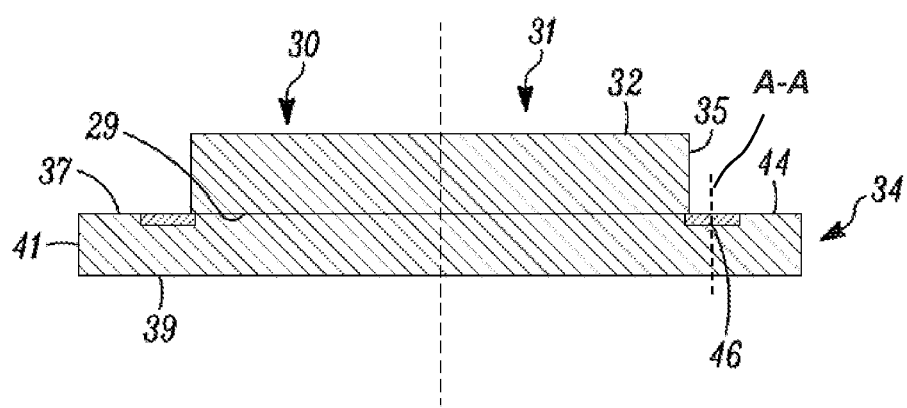
FIG. 3 is a schematic cross-sectional view along the line 3-3 of FIG. 2, according to some embodiments.

FIG. 2 is a top view of a sputtering target assembly 30 and FIG. 3 is a cross-sectional view of the sputtering target assembly 30 taken along line 3-3 of FIG. 2, according to some embodiments. The sputtering target assembly 30 includes a sputtering target 31 and a backing plate 34. In some embodiments, the sputtering target 31 and the backing plate 34 have circular or substantially circular cross-sectional shapes in the top view. In use, the backing plate 34 is connected to the sputter deposition apparatus, for example, by bolts or clamps.

The sputtering target 31 has a sputtering surface or front surface 32, a back surface 29 opposite the front surface 32, and a sidewall 35 extending between the front 32 and the back surface 29 about the circumference of the sputtering target 31. In some embodiments, the front surface 32 may be generally flat or planar. For example, the front surface 32 may be parallel to a horizontal first plane. In other embodiments, the front surface 32 may have one or more convex or concave portions or features. Additionally, or alternatively, the back surface 29 of the sputtering target 31 may be substantially planar. Alternatively, the back surface 29 may have protrusions or indentations. For example, the back surface 29 may receive or be received within a portion of the backing plate 34, a design which is known as an embedded backing plate.

The sputtering target 31 may be formed from any metal suitable for PVD processes. For example, the sputtering target 31 may include aluminum (Al), vanadium (V), niobium (Nb), copper (Cu), titanium (Ti), tantalum (Ta), tungsten (W), ruthenium (Ru), germanium (Ge), selenium (Se), zirconium (Zr), molybdenum (Mo), hafnium (Hf), and alloys thereof such as an Al alloy, a V alloy, a Nb alloy, a Cu alloy, a Ti alloy, a Ta alloy, a W alloy, a Ru alloy, a Ge alloy, a Se alloy, a Zr alloy, a Mo alloy, and a Hf alloy. Suitable alloys include but are not limited to copper-manganese (CuMn) alloys, aluminum-copper (AlCu) alloys, titanium-tungsten (TiW) alloys, tantalum-aluminum (TaAl) alloys, and ruthenium (Ru) alloys.

The backing plate 34 has a front surface 37, a back surface 39 opposite the front surface 37, and a sidewall 41 extending from the front surface 37 to the back surface 39 about the outer circumference of the backing plate 34. The back surface 29 of the sputtering target 31 is adjacent and bonded to the front surface 37 of the backing plate 34. The radius of the backing plate 34 is larger than that of the sputtering target 31, such that at least a portion of the backing plate 34, referred to as the flange 44, extends radially outward from the outer diameter or radial edge of the sputtering target 31. For example, the backing plate 34 and the sputtering target 31 may be part of an integral or monolithic sputtering target assembly 30. In other embodiments, the backing plate 34 and the sputtering target 31 may be separate pieces which are bonded together. In such embodiments, the backing plate 34 may be formed of the same or different material than the sputtering target 31.

The flange 44, which extends radially outward from the sputtering target 31, may be substantially flat or planar. In some embodiments, the exposed portion of the front surface 37 may be parallel or substantially parallel to the horizontal plane. In other embodiments, the exposed portion of the front surface 37 may be in a plane at an angle to the first plane. The flange 44 can include one or more counter bore holes and/or through-holes 45 connecting or bolting the backing plate 34 to the sputter deposition source or apparatus.

The backing plate 34 may be formed from any suitable metal. For example, the backing plate 34 may include aluminum (Al), vanadium (V), niobium (Nb), copper (Cu), titanium (Ti), tantalum (Ta), molybdenum (Mo), and alloys and combinations thereof. For example, alloys include an Al alloy (such as 6061 or 2024), a V alloy, a Nb alloy, a Cu alloy (such as CuZn, CuCr, C18000), a Ti alloy, a Ta alloy, and a Mo alloy. In some embodiments, the backing plate 34 and the sputtering target 31 may be formed of the same material. In other embodiments, the backing plate 34 and the sputtering target 31 may be formed of different materials.

The backing plate 34 also includes a sputter trap 46 formed on the front surface 37 of the flange 44. In some embodiments, the sputter trap 46 can extend from where the sidewall of the sputtering target 31 meets the front surface 37 of the backing plate 34. For example, the sputter trap 46 can extend radially about the circumference of the sputtering target 31. In some embodiments, the back surface of the target 31 can have an outer radius of r1 and the sputter trap 46 can have an inner radius of r1 and an outer radius of r2. For example, the sputter trap 46 can be formed immediately adjacent to where the target 31 joins to the backing plate 34. Additionally, or alternatively, the sputter trap 46 may be formed on the sidewall 35 of the sputtering target 31.

As discussed above, particle formation during the sputtering process is a concern because the particles, if deposited onto the substrate, may affect uniformity of the film formed. Even if a particle is trapped or captured in the sputter trap, there is a potential that the particle may flake off during the sputtering process. Thus, sputter traps may include textured surfaces to improve adhesion of stray particles. For example, in some embodiments, the sputter trap 46 may include indentations, depressions, holes, and/or any other combination of macrotexture 48 and/or microtexture 50 as desired. In some embodiments, the sputter trap 46 may have a surface roughness that is greater than the surface roughness of the back surface 29 of the sputtering chamber component.

Figure 4:
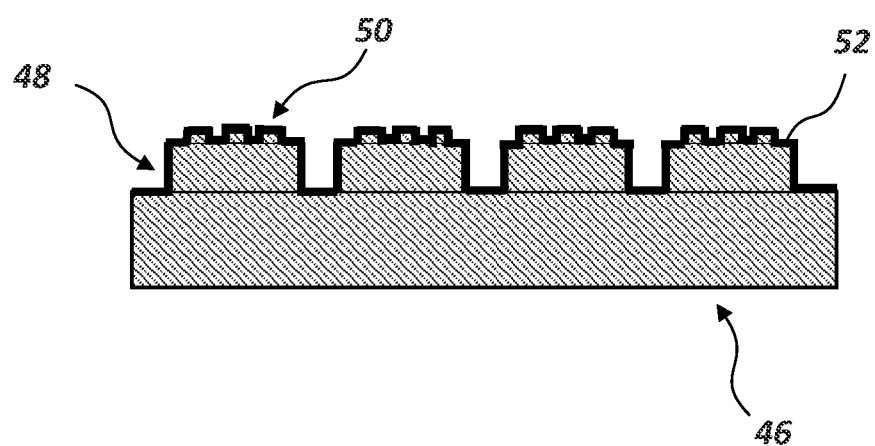
FIG. 4 is a schematic cross-sectional view of the sputter trap along line A-A of FIG. 3, according to some embodiments.

FIG. 4 is a cross-sectional view of the sputter trap 46. In some embodiments, the sputter trap 46 includes a layer 52 formed thereon. The layer 52 may completely or entirely cover the outer surface of the sputter trap 46. In this way, the layer 52 masks or covers various impurities in the textured surface that contribute to reduced adhesion of sputtered material or contaminating particles onto the sputter trap 46. In some embodiments, the layer 52 may be formed, for example, by spraying and adhering metallic particles onto the surface of the sputter trap 46. In some embodiments, suitable metallic particles for forming the layer 52 may include one or more of titanium, tantalum, aluminum, or various alloys and combinations thereof. The particles of the layer 52 are selected to adhere to the outer surface of the sputter trap and to which particles in the sputter chamber will adhere. In some embodiments, the layer 52 may be the same material as the sputter trap. In other embodiments, the layer 52 may be a material different than that of the sputter trap.

In some embodiments, the metallic particles may be adhered to the sputter trap 46 via a cold spray process in which the metallic particles are accelerated at high velocities and impacted with the surface of the sputter trap 46. During impact, the particles undergo plastic deformation and adhere to the surface. In some embodiments, particles may be formed from a powder source, such as various metallic powders. In some embodiments, the particles may have a certain particle size distribution. For example, the particles may have an average particle size from about 200 mesh (0.074 mm) to about 320 mesh (0.04 mm). Various particle sizes may be used to obtain a certain surface roughness of the sputter trap 46 as desired. In some examples, more than one particle size may be used, for example, to obtain a sputter trap 46 having a bimodal particle size distribution.

In some embodiments, the particles in the layer 52 may be able to be substantially diffused upon adhesion to the surface of the sputter trap 46, giving the layer 52 a uniform distribution of particles such that individual particles are substantially indistinguishable from one another.

In some embodiments, the layer 52 is substantially thin such that the surface texture of the sputter trap 46 is retained after formation of the layer 52. For example, the layer 52 may have a thickness from about 0.025 mm (0.001 inches) to about 2.54 mm (0.1 inches), from about 0.025 mm (0.001 inches) to about 0.254 mm (0.01 inches), from about 0.025 mm (0.001 inches) to about 0.127 mm (0.005 inches), or from about 0.025 mm (0.001 inches) to about 0.076 mm (0.003 inches). The thickness of the layer 52 can vary depending on the size, texture, and/or pattern of the textured surface. For example, textured surfaces having larger features or larger surface roughness may be compatible with thicker layers and textured surfaces having smaller features or smaller surface roughness may require thinner layers. For example, thicker layers may mask the surface macrotexture 48 and/or microtexture 50 of certain textured surfaces, which may reduce adhesion of the sputtered material onto the surface of the sputter trap 46. Therefore, in some instances, a thinner layer may lead to a preserved texture and improved adhesion.

In some embodiments, the layer 52 is substantially free of impurities. For example, the layer 52 may be at least about 99.99% pure, from 99.99% to about 99.995% pure, or at least about 99.995% pure. Impurities can include a variety of undesirable components such as carbon, carbides, metallic carbides, and metal oxides such as aluminum oxide. In some instances, impurities such as these may reduce adhesion of the sputtered material onto the surface of the sputter trap. Thus, a sputter trap having less impurities may lead to improved adhesion.

In some embodiments, the layer 52 is substantially free of impurities at a surface of the layer 52 (e.g., an area of the layer 52 that is exposed). For example, the concentration of impurities (e.g., metal-carbide, aluminum oxide, and/or other impurities) at the surface of the layer 52 is from about 70% to about 100%, from about 80% to about 99%, or from about 90% to about 95% less than the concentration of impurities in the front surface of the sputter trap before the layer is applied. For example, a concentration of metal-carbide at the surface of the layer 52 may be less than 70% of a concentration of metal-carbide in the front surface of the sputter trap before the layer is applied.

In some embodiments, a method of forming a coating layer 52 on a sputtering chamber component may include cold spraying the particles onto at least a portion of the sputtering chamber component. As discussed above, the sputtering chamber component may be, for example, a sputter trap. In some embodiments, the sputter trap may include a textured surface. For example, the surface of the sputter trap may include indentations, depressions, holes, and/or any other combination of macrotexture 48 and/or microtexture 50 as desired, or the sputter trap may have a surface roughness that is greater than the surface roughness of the back surface of the sputtering chamber component, as disclosed herein.

During cold spraying, a solid powder of metallic particles is accelerated toward the sputtering chamber component. In some embodiments, various impact velocities are chosen such that, upon impact, the particles plastically deform and adhere to the surface of the sputtering chamber component. Suitable impact velocities for cold spraying may depend on a variety of factors, including the size and/or composition of the particles to be sprayed, and will be known to those skilled in the art. In some embodiments, the impact velocity is suitable such that the particles form a substantially diffused layer. As described herein, a substantially diffused layer is defined as a layer having a uniform distribution of particles such that individual particles are substantially indistinguishable or indistinguishable from one another. In some embodiments, both a specific impact velocity and particle size may be chosen such that the particles form a substantially diffused layer.

After cold spraying, a layer 52 of metallic particles is formed on the surface of the sputter trap. In some embodiments, the layer 52 may be substantially thin and/or substantially free of impurities, as discussed above.

In some embodiments, the method may also include forming the textured surface on a least a portion of the sputtering chamber component before cold spraying. In various examples, the textured surface may be formed by a variety of methods including bead blasting, knurling, machining, and/or any other suitable texturizing technique. For example, when bead blasting is used, abrasive particles may be sprayed onto the surface of the sputter trap 46, impacting the surface and creating a texture. Similarly, a knurling process presses a pattern into the surface of the sputter trap 46 to create a texture, while a machining process cuts a pattern into the surface of the sputter trap 46. Though the above exemplary methods are disclosed herein, the surface texture may be formed by any suitable method known to those skilled in the art.

EXAMPLES

Example 1: Silicon Carbide Grit Blasted Control Sample

Figure 5A:
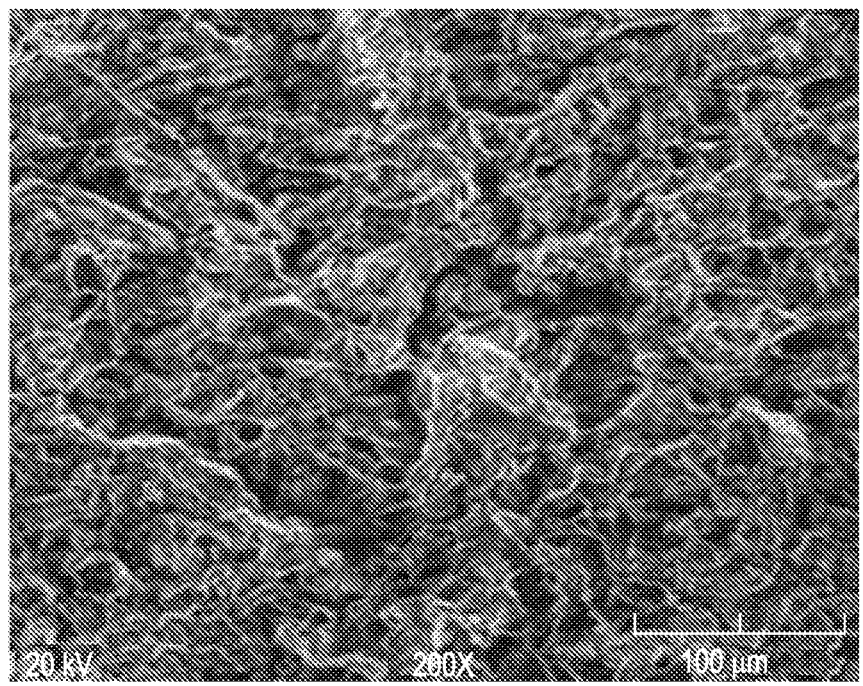
FIG. 5A is an image of a surface of a sputter trap without an exemplary coating layer, according to some embodiments.
Figure 5B:
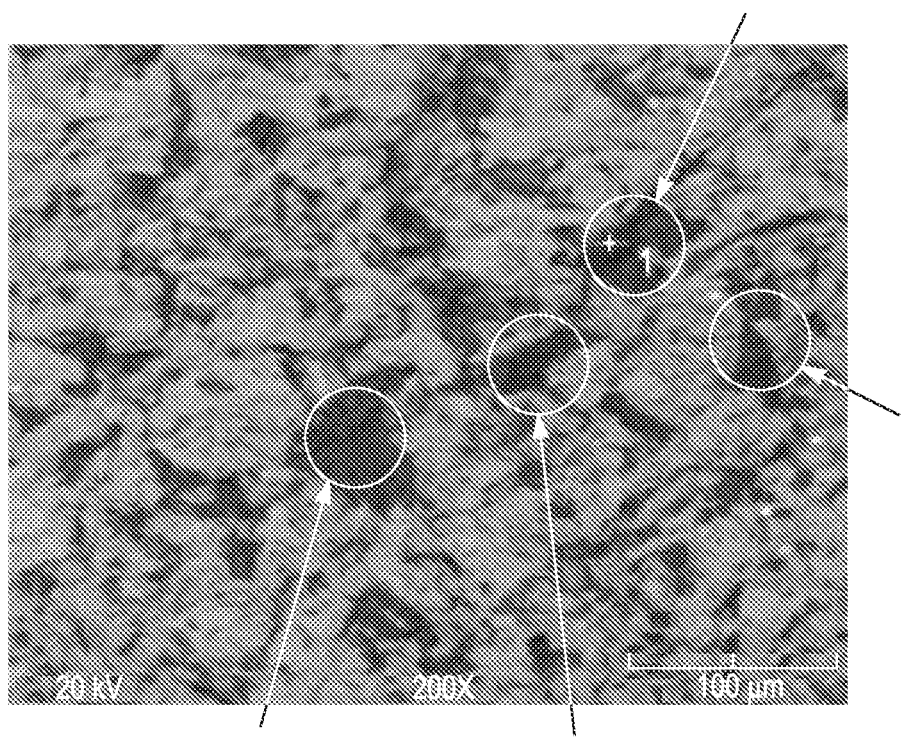
FIG. 5B is an image of a surface of a sputter trap without an exemplary coating layer, according to some embodiments.

A sputtering chamber component in the form of a titanium sputter trap was subjected to grit blasting with silicon carbide such that a textured surface was formed. No layer was formed thereon. FIG. 5A is a secondary electron (SE) image and FIG. 5B is a backscattered electron (BSE) image of the surface of the control sample. As shown in FIG. 5B, large areas of silicon carbide impurities are visible.

Example 2: Cold Sprayed Sample with Thin High-Purity Coating Layer

An exemplary coating layer was formed on the surface of a sputtering chamber component in the form of a titanium sputter trap. The surface of the sputter trap was first grit blasted with silicon carbide to form a textured surface. The coating layer was then formed on the textured surface via cold spraying titanium (Ti) particles in the form of a metallic powder. The titanium particles were approximately 320 mesh with 4N5 (99.995%) purity. The average thickness of the resulting coating layer was from about 0.0508 mm to about 0.0862 mm.

Figure 6A:
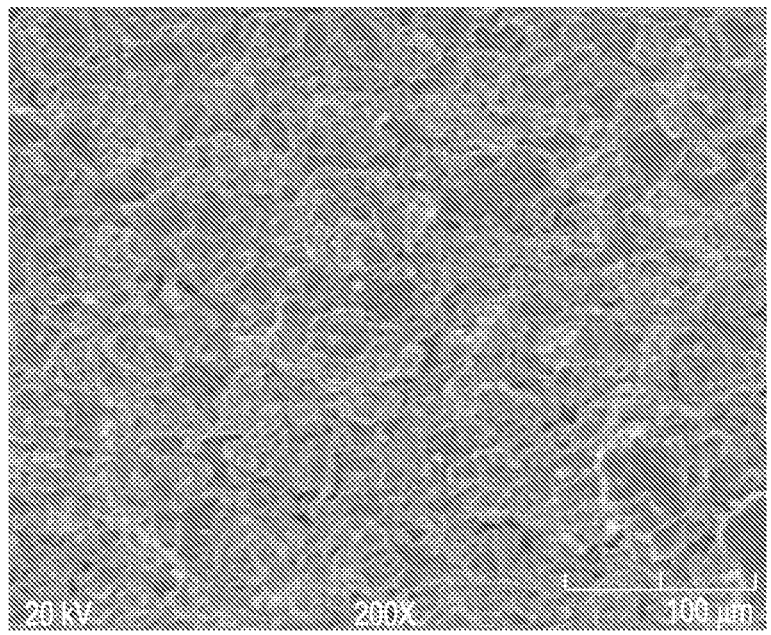
FIG. 6A is an image of a surface of a sputter trap with an exemplary coating layer, according to some embodiments.

FIG. 6A is a SE image of the surface of the sputter trap including the coating layer. As shown, the layer is homogenous and uniform with a high-density distribution of particles. The layer also shows less impurities than that of the control sample. Thus, the surface of the sputter trap showed less impurities as compared to the surface of the control sample (e.g., prior to formation of the coating layer).

Figure 6B:
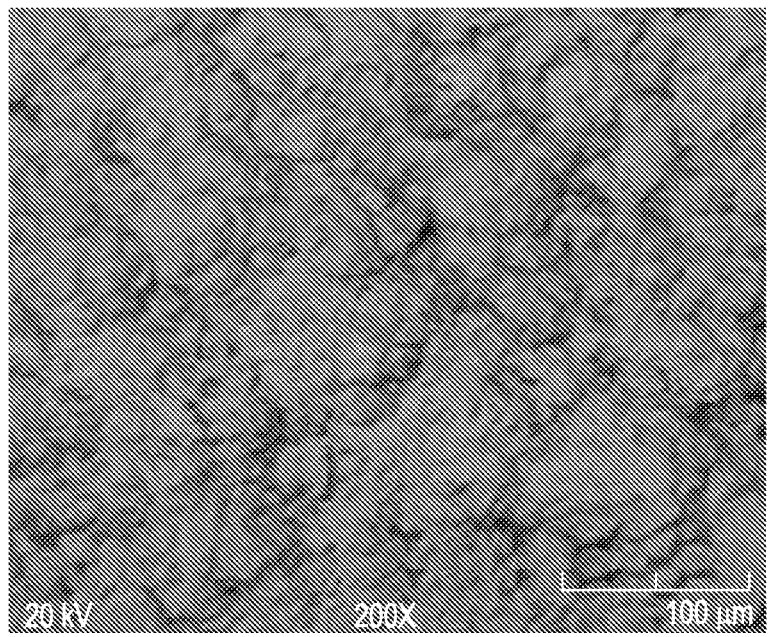
FIG. 6B is an image of a surface of a sputter trap with an exemplary coating layer, according to some embodiments.

FIG. 6B is a BSE image of the surface of the sputter trap including the coating layer. As shown, the layer is homogenous and uniform with a high-density distribution of particles. Thus, the layer is substantially thin such that the textured surface on the outer surface of the sputter trap is preserved. The surface of the sputter trap with the coating layer also had less impurities than that of the control sample.

Example 3: Comparison of Surface Impurities in Cold Sprayed Sample Vs. Control Sample An exemplary coating layer was formed on the surface of a sputtering chamber component in the form of a titanium sputter trap. The surface of the sputter trap was first grit blasted with silicon carbide to form a textured surface. The coating layer was then formed on the textured surface via cold spraying titanium (Ti) particles in the form of a metallic powder. The titanium particles were approximately 320 mesh with 4N5 (99.995%) purity. The average thickness of the resulting coating layer was from about 0.0508 mm to about 0.0762 mm. Spectrograph results for the sputter trap with the exemplary coating layer (Sample 1) and two control samples (Samples 2 and 3) are shown in Table 1. Sample 2 was grit blasted with silicon carbide and does not include a coating layer. Sample 3 was grit blasted with aluminum oxide and does not include a coating layer. As shown, Sample 1, which included the exemplary coating layer, had a lower concentration of carbon as well as all metals as compared to the sputter traps without the exemplary coating layer.

TABLE 1

| Sample | C | N | O | Al | Si | Cu | Mg | Fe | Zn |
|---|---|---|---|---|---|---|---|---|---|
| 1 | 25.4 | 9 | 43.1 | — | — | — | — | — | 0.1 |
| 2 | 38.9 | 2.1 | 39.1 | — | 8.3 | 0.1 | 0.3 | 0.3 | 0.3 |
| 3 | 31 | 1.4 | 44.9 | 11.8 | 1 | — | 0.2 | 0.2 | 0.3 |

Figure 7A:
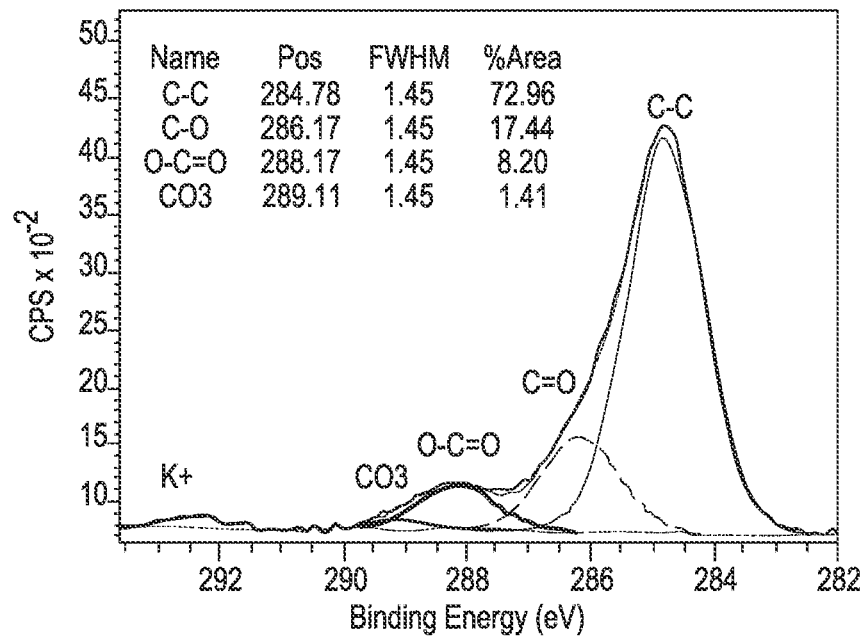
FIG. 7A is a spectrograph image showing concentrations of various components on a surface of a sputter trap with an exemplary coating layer, according to some embodiments.

FIG. 7A shows a spectrograph image showing concentrations of various components on the surface of the sputter trap with the exemplary cold-sprayed coating layer. As shown, there are no metal-carbide spectra visible in FIG. 7A. Therefore, the surface of the cold-sprayed coating layer was substantially free of undesirable impurities, namely metal-carbides.

Figure 7B:
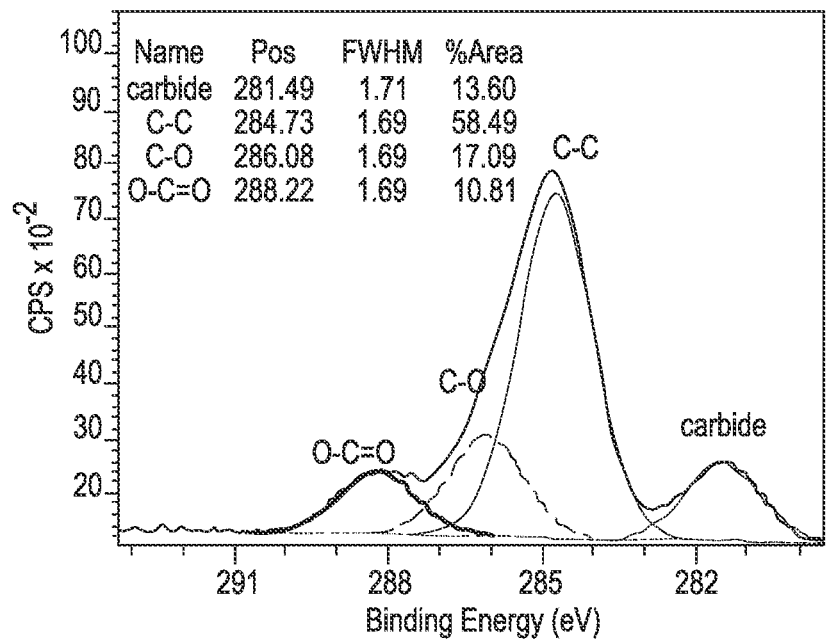
FIG. 7B is a spectrograph image showing concentrations of various components on a surface of a sputter trap without an exemplary coating layer, according to some embodiments.

FIG. 7B shows a spectrograph image showing concentrations of various components on the surface of the sputter trap without the exemplary coating layer. The sputter trap was grit blasted with silicon carbide to form a textured surface. FIG. 7B shows some metal-carbides present in the grit-blasted surface.

Figure 7C:
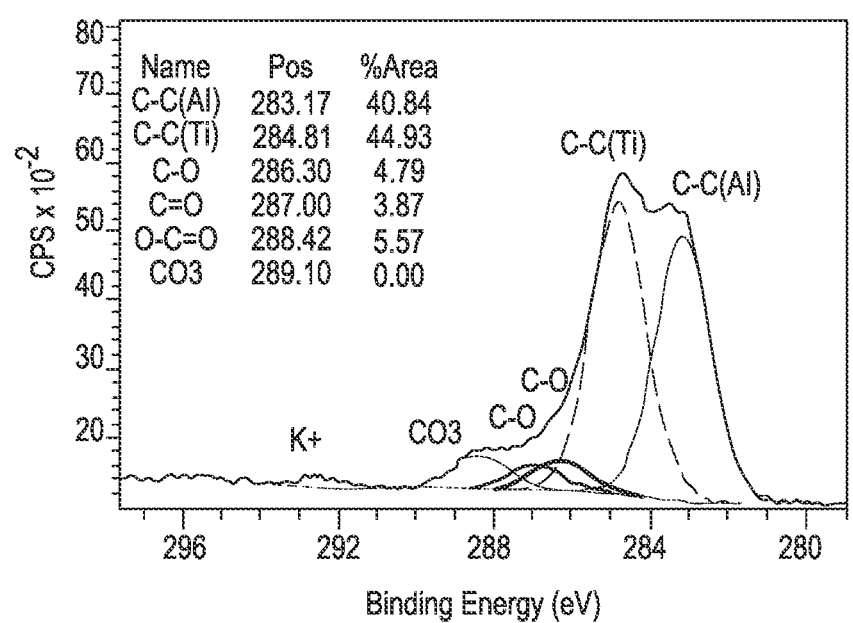
FIG. 7C is a spectrograph image showing concentrations of various components on a surface of a sputter trap without an exemplary coating layer, according to some embodiments.

FIG. 7C shows a spectrograph image showing concentrations of various components on the surface of the sputter trap without the exemplary coating layer. The sputter trap was grit blasted with aluminum oxide to form a textured surface. FIG. 7C shows some metal-carbides and metal-oxides present in the grit-blasted surface.

Various modifications and additions can be made to the exemplary embodiments discussed without departing from the scope of the present invention. For example, while the embodiments described above refer to particular features, the scope of this invention also includes embodiments having different combinations of features and embodiments that do not include all of the above described features.

The following is claimed:

1. A sputtering chamber component comprising:
    a front surface formed of an aluminum or copper alloy;
    a back surface opposite the front surface;
    a sputter trap formed on at least a portion of the front surface, the sputter trap having a surface roughness greater than the back surface of the sputtering chamber component; and
    a coating of titanium particles formed on the sputter trap, the coating having a thickness from about 0.025 mm to about 2.54 mm (0.001 inches to about 0.1 inches) and is at least about 99.99% pure, wherein the titanium particles of the coating are substantially diffused and have plastic deformation.

2. The sputtering chamber component of claim 1, wherein the coating is at least about 99.995% pure.

3. The sputtering chamber component of claim 1, wherein a concentration of metal-carbide at a surface of the coating is about 70% to 100% less than a concentration of metal-carbide on the front surface of the sputter trap before the coating is applied.

4. The sputtering chamber component of claim 1, wherein a surface of the coating is substantially free of metal-carbides.

5. The sputtering chamber component of claim 1, wherein a surface of the coating is substantially free of aluminum oxide.

6. The sputtering chamber component of claim 1, wherein the titanium particles of the coating are uniformly distributed throughout the coating.

7. The sputtering chamber component of claim 1, wherein the coating is formed from particles have an average particle size from about 200 mesh to about 320 mesh.

8. The sputtering chamber component of claim 1, wherein the coating has a thickness from about 0.025 mm to about 0.25 mm (about 0.001 inches to about 0.01 inches).

9. The sputtering chamber component of claim 1, wherein the sputtering chamber component is a backing plate of a sputtering target assembly.

10. The sputtering chamber component of claim 1, wherein the sputtering chamber component is a backing plate of a monolithic sputtering target assembly.

11. The sputtering chamber component of claim 1, wherein the sputter trap with the coating has a surface roughness greater than the roughness greater than the back surface of the sputtering chamber component.

12. A method of forming a sputter trap on an aluminum or copper alloy sputtering chamber component, the method comprising:
    cold spraying titanium particles on at least a portion of a textured surface of the sputtering chamber component such that the particles undergo plastic deformation and adhere to the textured surface to form a layer in which the individual particles are substantially indistinguishable from one another, the layer having a thickness from about 0.025 mm to about 2.54 mm (0.001 inches to about 0.1 inches) and is from about 99.99% to about 99.995% pure.

13. The method of claim 12, further comprising forming the textured surface on at least a portion of the sputtering chamber component by bead blasting, knurling, or machining.

14. The method of claim 12, wherein a concentration of metal-carbide at a surface of the layer is less than 70% of a concentration of metal-carbide in the at least a portion of the textured surface of the sputtering chamber component before the layer is applied.

15. The method of claim 12, wherein the thickness of the layer is from about 0.025 mm to about 0.25 mm (0.001 inches to about 0.01 inches).

16. The method of claim 12, wherein the thickness of the layer is from about 0.025 mm to about 0.127 mm (0.001 inches to about 0.005 inches).

17. The method of claim 12, wherein the cold spraying comprises cold spraying titanium particles having an average particle size from about 200 mesh to about 320 mesh.

18. The method of claim 12, wherein the sputtering chamber component is a backing plate of a sputtering target assembly.

19. The method of claim 12, wherein the sputtering chamber component is a backing plate of a monolithic sputtering target assembly.

20. The method of claim 12, wherein after cold spraying the titanium particles, a surface texture of the textured surface is retained.

* * * * *